(12) United States Patent
Kishi et al.

(10) Patent No.: US 6,765,824 B2
(45) Date of Patent: Jul. 20, 2004

(54) MAGNETO-RESISTANCE ELEMENT CAPABLE OF CONTROLLING THE POSITION AND SIZE OF EDGE DOMAIN AND THE COERCIVITY AND MAGNETIC MEMORY

(75) Inventors: Tatsuya Kishi, Yokohama (JP); Yoshiaki Saito, Kawasaki (JP); Minoru Amano, Kawasaki (JP); Shigeki Takahashi, Yokohama (JP); Katsuya Nishiyama, Yokohama (JP); Tomomasa Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/391,423

(22) Filed: Mar. 19, 2003

(65) Prior Publication Data

US 2003/0185050 A1 Oct. 2, 2003

(30) Foreign Application Priority Data

Mar. 29, 2002 (JP) ........................................ 2002-097759

(51) Int. Cl.$^7$ ............................................... G11C 11/15
(52) U.S. Cl. ..................... 365/173; 365/171; 365/158; 365/51
(58) Field of Search ................................. 365/158, 173, 365/171, 132, 51

(56) References Cited

U.S. PATENT DOCUMENTS

| | | | | |
|---|---|---|---|---|
| 4,731,757 A | * | 3/1988 | Daughton et al. | .......... 365/173 |
| 5,748,524 A | | 5/1998 | Chen et al. | .................. 365/173 |
| 5,757,695 A | * | 5/1998 | Shi et al. | ..................... 365/158 |
| 6,205,053 B1 | | 3/2001 | Anthony | ..................... 365/173 |
| 6,605,836 B2 | * | 8/2003 | Kishi et al. | .................. 257/295 |

FOREIGN PATENT DOCUMENTS

| | | | |
|---|---|---|---|
| JP | 11-273337 | 10/1999 | ........... G11C/11/15 |
| JP | 2000-100153 | 4/2000 | ........... G11C/11/14 |

OTHER PUBLICATIONS

Youfeng Zheng, et al. "Switching Field Variation in Patterned Submicron Magnetic Film Elements" J. Appl. Phys. 81 (8), Apr. 15, 1997, pp. 5471–5473.
U.S. patent application Ser. No. 10/097,571, Kishi et al., filed Mar. 15, 2002.
U.S. patent application Ser. No. 10/391,423, Kishi et al., filed Mar. 19, 2003.
U.S. patent application Ser. No. 10/653,098, Kai et al., filed Sep. 3, 2003.

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

There is provided a magnetoresistance element in which a shape of a free ferromagnetic layer includes a first portion with a parallelogrammic contour, and second portions that protrude from a pair of opposite corners of the first portion respectively in a main direction parallel to a pair of opposite sides of the first portion, the shape is asymmetric with respect to a line that passes through a center of the first portion and is parallel to the main direction, and an axis of easy magnetization of the free ferromagnetic layer falls within a range defined by an acute angle that a first direction makes with a second direction, the first direction being substantially parallel to the main direction and the second direction being substantially parallel to the longest line segment that joins contours of the second portions.

20 Claims, 9 Drawing Sheets

MAGNETO-RESISTANCE ELEMENT CAPABLE OF CONTROLLING THE POSITION AND SIZE OF EDGE DOMAIN AND THE COERCIVITY AND MAGNETIC MEMORY

CROSS-REFERENCE TO RELATED APPLICATIONS

This application is based upon and claims the benefit of priority from the prior Japanese Patent Application No. 2002-097759, filed Mar. 29, 2002, the entire contents of which are incorporated herein by reference.

BACKGROUND OF THE INVENTION

1. Field of the Invention

The present invention relates to a magnetoresistance element and a magnetic memory.

2. Description of the Related Art

A magnetoresistance element includes a pair of ferromagnetic layers laminated one upon the other with a nonmagnetic layer interposed therebetween. The resistance value of the magnetoresistance element is changed in accordance with the direction of the magnetization of one ferromagnetic layer relative to the magnetization of the other ferromagnetic layer. The magnetoresistance element producing the particular magnetoresistance effect can be used in various fields, e.g., in a magnetic memory.

In a magnetic memory, one of the ferromagnetic layers acts as a pinned ferromagnetic layer that retains the direction of the magnetization thereof unchanged on applying a magnetic field, and the other ferromagnetic layer acts as a free ferromagnetic layer that is capable of changing the direction of the magnetization thereof on applying the magnetic field so as to store information. To be more specific, information is written in the magnetic memory by the resultant magnetic field generated when a current pulse passes through a word line and a bit line. As a result, the magnetization of the free ferromagnetic layer is changed between, for example, the parallel state and the antiparallel state, relative to the magnetization of the pinned ferromagnetic layer. In this fashion, binary information of "0" and "1" is written in accordance with these two states. Also, when the written information is read out, an electric current is passed through the magnetoresistance element. Since the resistance value of the magnetoresistance element under one of the two states noted above, i.e., the parallel state, differs from that under the other state, i.e., the antiparallel state, it is possible to read out the written information by detecting the current flowing through the magnetoresistance element (the resistance value).

It should be noted that, in order to enhance the degree of integration of a magnetic memory, it is highly effective to make smaller the area of the magnetoresistance element. However, when an external magnetic field is not applied, or is too weak, a complex magnetic domain structure consisting of a plurality of domains is formed in the vicinity of the edge portion of the free ferromagnetic layer. If the area of the free ferromagnetic layer is made smaller, the proportion of the edge portion relative to the entire free ferromagnetic layer increases, with the result that, in, for example, an oblong free ferromagnetic layer, the direction of the magnetization in both edge portions in the longitudinal direction of the free ferromagnetic layer is rendered different from that in the central portion of the free ferromagnetic layer. In other words, a so-called "edge domain" is generated as described in, for example, "J. App. Phys." 81, 5471 (1997). In this case, the magnetization of the free ferromagnetic layer is lowered, which lowers the magnetoresistivity. Also, in this case, the change in the magnetic structure in reversing the magnetization is rendered complex. As a result, the possibility of noise generation is increased. In addition, the coercive force is increased, which increases the intensity of the magnetic field required for the switching (switching magnetic field).

Concerning the technology for suppressing the edge domain, it is known to the art that the shape of the free ferromagnetic layer is made asymmetric to the axis of easy magnetization thereof, particularly, the free ferromagnetic layer is made to have a shape of a parallelogram, as disclosed in, for example, Jpn. Pat. Appln. KOKAI Publication No. 11-273337. Where the free ferromagnetic layer is shaped as above, it is possible to make smaller the area of the edge domain so as to make it possible for the entire ferromagnetic layer to be formed of a substantially single magnetic domain.

Also, concerning the technology for preventing the change in the magnetic structure from being made complex in reversing the magnetization, it is known to the art that a structure to which a hard bias is applied is added to the both edge portions of the free ferromagnetic layer, as disclosed in, for example, U.S. Pat. No. 5,748,524 and Japanese Patent Disclosure No. 2000-100153.

Further, it is known to the art that a small portion projecting in a direction perpendicular to the axis of easy magnetization of the free ferromagnetic layer is formed in the free ferromagnetic layer so as to produce an H or I-shaped ferromagnetic layer instead of a simple quadrilateral, thereby stabilizing the edge domain and avoiding the formation of a complex magnetic domain, as disclosed in U.S. Pat. No. 6,205,053.

However, where the free ferromagnetic layer is made to have a shape of parallelogram, the coercive force is generally rendered excessively large.

Large coercive force stabilizes two stable states of magnetization and makes the stable states hard to be influenced by thermal agitation. Therefore, large coercive force is preferred in terms of stability of information stored. The increase in the coercive force, however, implies an increase of the switching magnetic field, since the magnitude of the coercive force provides a criterion of the magnitude of the switching magnetic field. To be more specific, it is thus necessary to flow a larger current into the write wiring for writing information in the magnetic memory, which brings about undesirable results, such as an increase in the power consumption and the shortening of the wiring life.

Also, where a structure to which a hard bias is applied is added to the both edge portions of the free ferromagnetic layer, the coercive force is increased, though it is certainly possible to control the behavior in terms of the change in the magnetic structure. In addition, in this technology, it is necessary to add a structure for stabilizing the edge domain and, thus, this technology is not adapted for the increase in the density required for a large capacity memory or the like.

Further, where the free ferromagnetic layer is H-shaped or I-shaped, it is necessary to enlarge the projecting portion in order to permit the projecting portion to produce a sufficient effect. In this case, the area occupied by the magnetoresistance element is increased, making it difficult to achieve the high degree of integration required for a large capacity memory.

BRIEF SUMMARY OF THE INVENTION

According to a first aspect of the present invention, there is provided a magnetoresistance element, comprising a first pinned ferromagnetic layer that retains a magnetization direction thereof unchanged on applying a magnetic field, a free ferromagnetic layer that faces the first pinned ferromagnetic layer and is capable of changing a magnetization direction thereof on applying the magnetic field, and a first nonmagnetic layer intervening between the first pinned ferromagnetic layer and the free ferromagnetic layer, wherein a shape of the free ferromagnetic layer that is viewed perpendicularly to a main surface thereof includes a first portion with a parallelogrammic contour and a pair of second portions that protrude from a pair of opposite corners of the first portion respectively in a main direction parallel to a pair of opposite sides of the first portion, the shape of the free ferromagnetic layer is asymmetric with respect to a line that passes through a center of the first portion and is parallel to the main direction, and an axis of easy magnetization of the free ferromagnetic layer falls within a range defined by an acute angle that a first direction makes with a second direction, the first direction being substantially parallel to the main direction and the second direction being substantially parallel to the longest line segment that joins contours of the second portions.

According to a second aspect of the present invention, there is provided a magnetoresistance element, comprising a first pinned ferromagnetic layer that retains a magnetization direction thereof unchanged on applying a magnetic field, a free ferromagnetic layer that faces the first pinned ferromagnetic layer and is capable of changing a magnetization direction thereof on applying the magnetic field, and a first nonmagnetic layer intervening between the first pinned ferromagnetic layer and the free ferromagnetic layer, wherein a shape of the free ferromagnetic layer that is viewed perpendicularly to a main surface thereof includes a first portion with a quadrilateral contour whose first opposite sides are parallel to each other and whose second opposite sides are parallel to each other, and a pair of second portions that extend from a pair of opposite corner parts of the first portion in a main direction parallel to the second opposite sides respectively and whose maximum widths in a direction parallel to the first opposite sides are narrower than lengths of the first opposite sides, the shape is asymmetric with respect to a line that passes through a center of the first portion and is parallel to the second opposite sides, and an axis of easy magnetization of the free ferromagnetic layer falls within a range defined by an acute angle that a first direction makes with a second direction, the first direction being substantially parallel to the main direction and the second direction being substantially parallel to the longest line segment that joins contours of the second portions.

According to a third aspect of the present invention, there is provided a magnetoresistance element, comprising a first pinned ferromagnetic layer that retains a magnetization direction thereof unchanged on applying a magnetic field, a free ferromagnetic layer that faces the first pinned ferromagnetic layer and is capable of changing a magnetization direction thereof on applying the magnetic field, and a first nonmagnetic layer intervening between the first pinned ferromagnetic layer and the free ferromagnetic layer, wherein a shape of the free ferromagnetic layer that is viewed perpendicularly to a main surface thereof includes a first portion with a parallelogrammic contour and a pair of second portions that protrude from a pair of opposite corners of the first portion respectively in a main direction parallel to a pair of opposite sides of the first portion, the shape of the free ferromagnetic layer is asymmetric with respect to a line that passes through a center of the first portion and is parallel to the main direction, and a direction of the magnetization of the first pinned ferromagnetic layer falls within a range defined by an acute angle that a first direction makes with a second direction, the first direction being substantially parallel to the main direction and the second direction being substantially parallel to the longest line segment that joins contours of the second portions.

According to a fourth aspect of the present invention, there is provided a magnetoresistance element, comprising a first pinned ferromagnetic layer that retains a magnetization direction thereof unchanged on applying a magnetic field, a free ferromagnetic layer that faces the first pinned ferromagnetic layer and is capable of changing a magnetization direction thereof on applying the magnetic field, and a first nonmagnetic layer intervening between the first pinned ferromagnetic layer and the free ferromagnetic layer, wherein a shape of the free ferromagnetic layer that is viewed perpendicularly to a main surface thereof includes a first portion with a quadrilateral contour whose first opposite sides are parallel to each other and whose second opposite sides are parallel to each other, and a pair of second portions that extend from a pair of opposite corner parts of the first portion in main a direction parallel to the second opposite sides respectively and whose maximum widths in a direction parallel to the first opposite sides are narrower than lengths of the first opposite sides, the shape is asymmetric with respect to a line that passes through a center of the first portion and is parallel to the second opposite sides, and a direction of the magnetization of the first pinned ferromagnetic layer falls within a range defined by an acute angle that a first direction makes with a second direction, the first direction being substantially parallel to the main direction and the second direction being substantially parallel to the longest line segment that joins contours of the second portions.

According to a fifth aspect of the present invention, there is provided a magnetic memory, comprising a word line, a bit line intersecting the word line, and a memory cell positioned at or near an intersection portion of the word and bit lines and including the element according to one of first to fourth aspects of the present invention.

It is noted that "an axis (or direction)... falls within a range defined by an acute angle that a first direction makes with a second direction" corresponds to the configuration that the axis (or direction) is parallel to one of the first and second directions or the configuration that the axis (or direction) intersects each of the first and second directions at an angle narrower than the acute angle noted above.

In the first to fifth aspects of the present invention, it is possible for the first nonmagnetic layer to be a nonmagnetic metal layer or an insulating layer.

Also, it is possible for a direction of the magnetization of the first pinned ferromagnetic layer to fall within the range defined by the acute angle.

Further, it is possible for the magnetoresistance element to further comprise a second pinned ferromagnetic layer that retains a magnetization direction thereof unchanged on applying the magnetic field, and a second nonmagnetic layer intervening between the free ferromagnetic layer and the second pinned ferromagnetic layer. In this case, it is possible for the first and second pinned ferromagnetic layer to be a nonmagnetic metal layer or an insulating layer.

As described above, it is possible for the magnetoresistance element to be an element exhibiting a giant magnetoresistance effect or a ferromagnetic tunnel junction element such as a ferromagnetic single tunnel junction element having a ferromagnetic single tunnel junction formed therein or a ferromagnetic double tunnel junction element having a ferromagnetic double tunnel junction formed therein.

In the first to fifth aspects of the present invention, it is possible for the first portion to be square or rectangle in shape.

Also, it is possible for the second portions to be rotation symmetrical with respect to a 2-fold axis that passes through the center of the first portion and is perpendicular to the main surface of the free ferromagnetic layer. Further, it is possible for each of the two second portions to be triangle, semicircle, square or rectangle in shape.

Still further, it is possible for the shape of the free ferromagnetic layer to consists of the first and second portions.

Incidentally, the expression "substantially parallel" referred to above implies that the deviation from the parallel state is within several degrees.

DETAILED DESCRIPTION OF THE INVENTION

Embodiments of the present invention will now be described with reference to the accompanying drawings. Throughout the accompanying drawings, the constituting members performing the same or similar functions are denoted by the same reference numerals so as to avoid an overlapping description.

Figure 1:
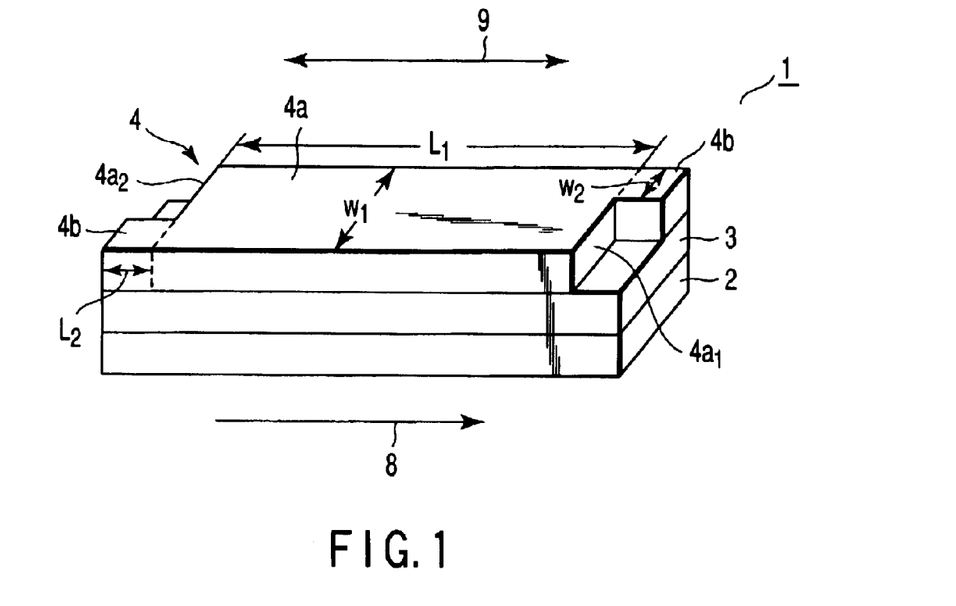
FIG. 1 is an oblique view schematically showing the construction of a magnetoresistance element according to a first embodiment of the present invention.

FIG. 1 is an oblique view schematically showing the construction of a magnetoresistance element 1 according to a first embodiment of the present invention. As shown in the drawing, the magnetoresistance element 1 includes a pinned ferromagnetic layer 2, a nonmagnetic layer 3 and a free ferromagnetic layer 4, which are laminated one upon the other in the order mentioned.

A unidirectional magnetic anisotropy is imparted to the pinned ferromagnetic layer 2 in the direction denoted by an arrow 8. In other words, the pinned ferromagnetic layer 2 is magnetized in the direction denoted by the arrow 8, and this magnetized state is maintained in applying a writing magnetic field to the magnetoresistance element 1.

On the other hand, a uniaxial magnetic anisotropy is imparted to the free ferromagnetic layer 4 in a direction denoted by the double-point arrow 9. In other words, arrow 9 corresponds to the axis of easy magnetization of the free ferromagnetic layer 4. In the free ferromagnetic layer 4, the two states where the magnetization is directed rightward and leftward are stable, and the switching between these two states can be performed by applying a writing magnetic field.

When observed in a direction perpendicular to the main surface, the free ferromagnetic layer 4 is shaped to include a first portion 4a and a pair of second portions 4b. Incidentally, in FIG. 1, the boundary between the first portion 4a and the second portion 4b is denoted by a broken line.

The first portion 4a is a portion playing a main role as the free ferromagnetic layer 4, and it has a pair of sides or edge surfaces parallel to each other. The width $W_1$ of the first portion 4a in the direction parallel to the pair of sides or edge surfaces is constant. This shape is advantageous in increasing the degree of integration of, for example, a magnetic memory, if magnetoresistance elements 1 are utilized in a magnetic memory.

The pair of second portions 4b play an auxiliary role of controlling, for example, the position and the size of the edge domain of the free ferromagnetic layer 4, and the change in the magnetic structure in reversing the magnetization. These second portions 4b extend perpendicularly from the left and right sides or edge surfaces $4a_1$, $4a_2$ of the first portion 4a. Also, the width $W_2$ of each of the second portions 4b is smaller than the width $W_1$ of the first portion 4a, and the area of each of the second portions is smaller than the area of the first portion 4a.

In the present embodiment, the free ferromagnetic layer 4, as viewed in a direction perpendicular to the main surface of the free ferromagnetic layer 4, is shaped asymmetric with respect to a straight line passing through the center of the first portion 4a, and perpendicular to the right and lefts sides or the edge surfaces of the first portion 4a. Also, in the present embodiment, the axis of easy magnetization of the free ferromagnetic layer 4 satisfies a certain relationship with the shape of the free ferromagnetic layer 4. This will now be described with reference to FIG. 2.

Figure 2:
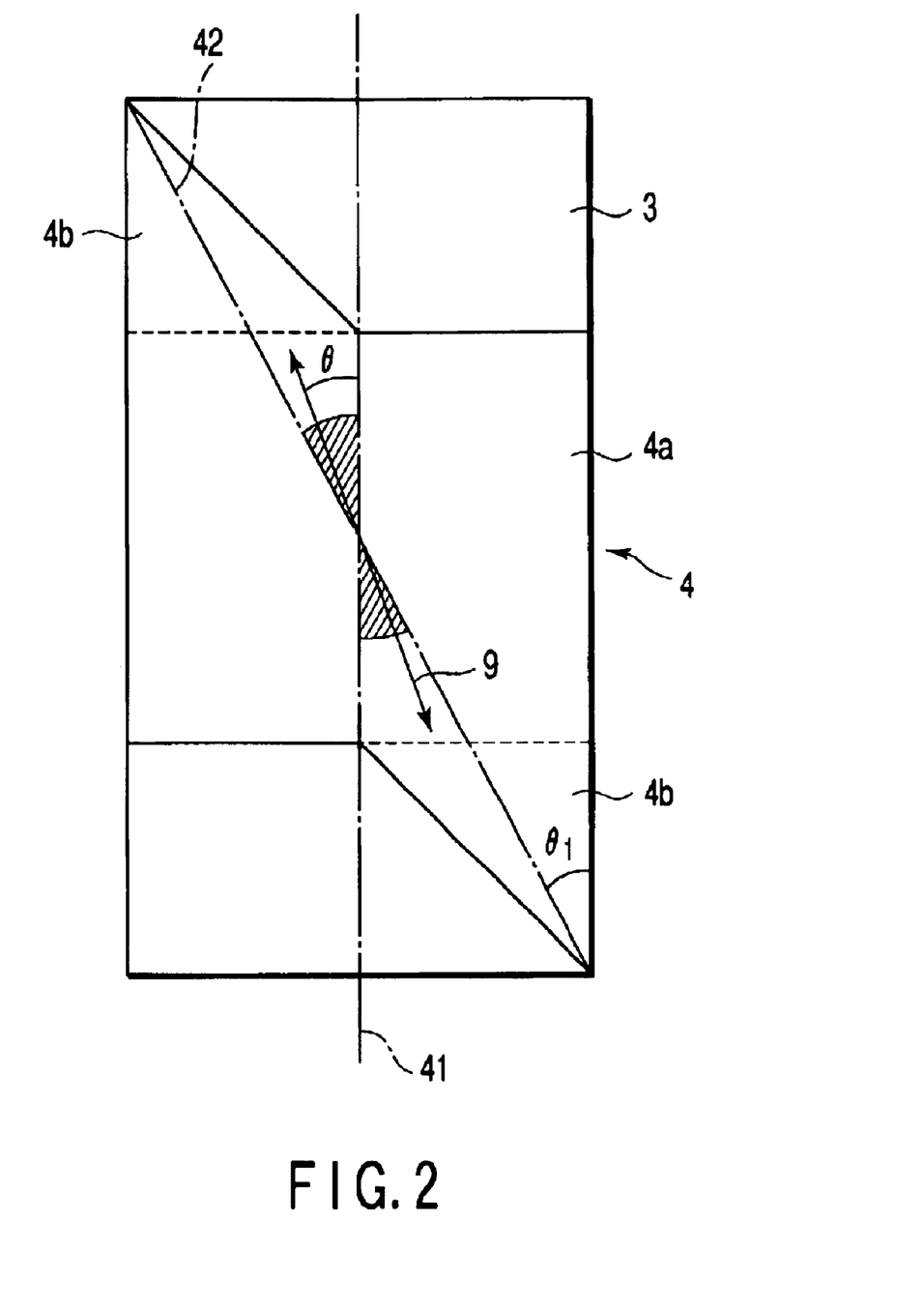
FIG. 2 is a plan view schematically showing another example of the magnetoresistance element according to the first embodiment of the present invention.

FIG. 2 is a plan view schematically showing another example of the magnetoresistance element according to the first embodiment of the present invention. In FIG. 2, an alternate long and short dash line 41 extending in the longitudinal direction is parallel to the lengthwise side of the first portion 4a, and another alternate long and short dash line 42, which extends obliquely, is the longest line that joins the contours of the second portions 4b or a straight line parallel to the longest line noted above. Also, the angle θ denotes the angle made between the axis 9 of easy magnetization of the free ferromagnetic layer 4 and the straight line 41, and the angle $θ_1$ denotes the angle made between the straight line 42 and the lengthwise side of the first portion 4a (or the straight line 41).

In the present embodiment, the angle θ is not smaller than 0° and not larger than $θ_1$. Owing to this construction, it is possible to obtain a sufficiently large residual magnetization, and to achieve a magnetic reversal under a relatively weak magnetic field simultaneously, even if the area of the free ferromagnetic layer 4 is made small. This will now be described with reference to FIGS. 3A and 3B.

Figure 3A:
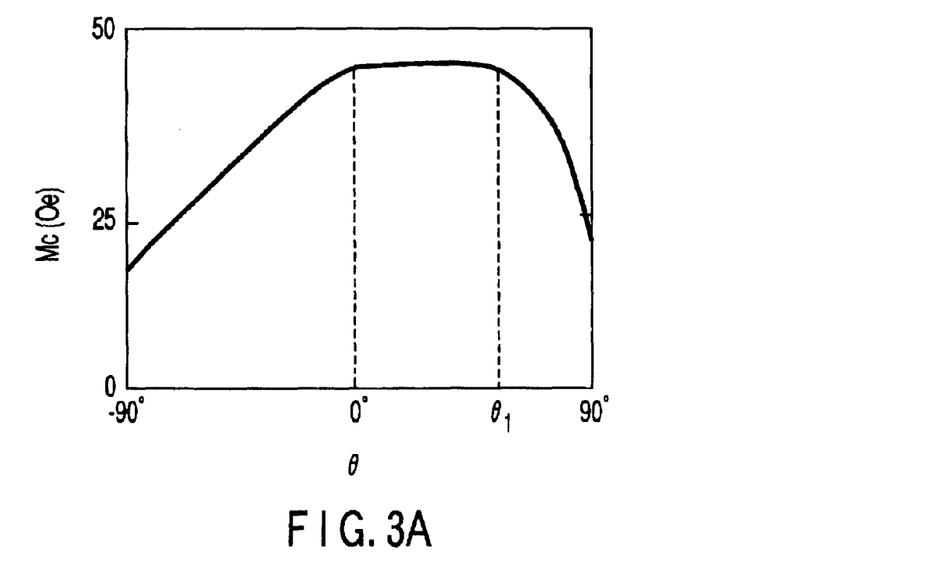
FIG. 3A is a graph exemplifying the relationship between the angle θ and the coercive force $H_c$ in the magnetoresistance element shown in FIG. 2.
Figure 3B:
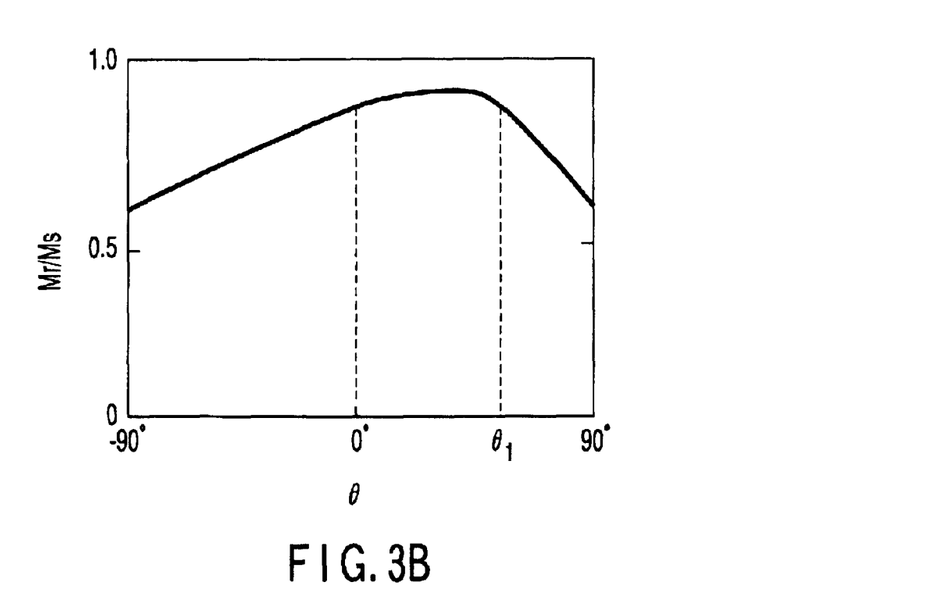
FIG. 3B is a graph exemplifying the relationship between the angle θ and the squareness ratio $M_r/M_s$ in the magnetoresistance element shown in FIG. 2.

FIG. 3A is a graph showing an example of the relationship between the angle θ and the coercive force $H_c$ in the magnetoresistance element shown in FIG. 2. FIG. 3B is a graph showing an example of the relationship between the angle θ and the squareness ratio $M_r/M_s$ (ratio of residual magnetization to the substance constant). In each of FIGS. 3A and 3B, the angle θ is plotted on the abscissa, the coercive force $H_c$ is plotted on the ordinate in FIG. 3A, and the squareness ratio $M_r/M_s$ is plotted on the ordinate in FIG. 3B.

Incidentally, the data given in FIGS. 3A and 3B was obtained by performing a simulation under the conditions given below. Specifically, the second portion 4b was assumed to be a right-angled isosceles triangle in shape, and a ratio $W_2/W_1$ of the maximum width $W_2$ of the second portion 4b to the width $W_1$ of the first portion 4a was set at 0.25. Also, NiFe was used as the material of the free ferromagnetic layer 4, and the thickness of the free ferromagnetic layer 4 was set at 2 nm.

As shown in FIGS. 3A and 3B, the magnetoresistance element exhibited both a high coercive force $H_c$ and a high squareness ratio $M_r/M_s$ when angle θ was not smaller than 0° and not larger than $θ_1$. In other words, it is possible to simultaneously obtain a sufficiently large residual magnetization, and to achieve a magnetic reversal under a relatively weak magnetic field, by setting the angle θ to fall within the range noted above.

It should also be noted that, with the above construction, the squareness ratio $M_r/M_s$ and the coercive force $H_c$ of the free ferromagnetic layer 4 are prevented from being rendered significantly nonuniform by the nonuniformity in the shape of the second portion 4b. In addition, the case where the axis 9 of easy magnetization of the free ferromagnetic layer 4 and/or the direction 8 of magnetization of the pinned ferromagnetic layer 2 is rendered substantially perpendicular to the right and left sides or the edge surfaces of the first portion 4a in the construction shown in FIG. 1 is advantageous over the case where the axis 9 and/or the direction 8 noted above is rendered substantially parallel to the right and left sides or the edge surfaces of the first portion 4a. This will be described next.

Specifically, in the construction that the axis 9 of easy magnetization of the free ferromagnetic layer 4 and/or the direction 8 of magnetization of the pinned ferromagnetic layer 2 is swung by, for example, 90° from the state shown in FIG. 1, the squareness ratio $M_r/M_s$ is greatly lowered in the case where the aspect ratio, i.e., the ratio of the length ($L_1$ direction) to the width ($W_1$ direction) of the free ferromagnetic layer 4, is low. On the other hand, in the construction that the axis 9 of easy magnetization of the free ferromagnetic layer 4 and/or the direction 8 of magnetization of the pinned ferromagnetic layer 2 is as shown in, for example, FIG. 1, it is possible to obtain a high squareness ratio $M_r/M_s$, even if the aspect ratio of the free ferromagnetic layer is low. It follows that the construction as shown in FIG. 1 is advantageous for increasing the degree of integration of the magnetic memory.

In the first embodiment, the shape of the first portion 4a is not particularly limited as far as the first portion 4a has a pair of sides or edge surfaces parallel to each other, and the width $W_1$ in the direction parallel to these sides or edge surfaces is constant between these sides or edge surfaces. It should be noted, however, that it is advantageous for the first portion 4a as viewed in the direction perpendicular to the main surface of the first portion 4a to be shaped square or oblong to increase the degree of integration of the magnetic memory.

In the first embodiment, it is desirable for the aspect ratio, i.e., the ratio of the length to the width of the free ferromagnetic layer 4, to fall within a range of between 1 and 3, more preferably between 1 and 2, and most preferably between 1 and 1.5. As described above, the decrease of the squareness ratio $M_r/M_s$ generally brings about a problem particularly if the aspect ratio is low. It follows that the effect described above is particularly important if the aspect ratio of the free ferromagnetic layer 4 falls within the range noted above.

In the first embodiment of the present invention, it is desirable for the second portions 4b to be rotation symmetric with respect to a 2-fold axis passing through the center of the first portion 4a and perpendicular to the main surface of the free ferromagnetic layer 4. In this case, when the magnetoresistance element 1 is used for preparing a magnetic memory, it is possible to obtain the same effect in the rewriting stage from the information "0" to the information "1" and in the rewriting stage from the information "1" to the information "0".

The shape of each of the two second portions 4b is not particularly limited. For example, it is possible for the second portion 4b to be triangular, semi-circular, semi-elliptical, square or rectangular. It should be noted, however, that each of the second portions 4b should be shaped to have the largest width on the side of the first portion 4a in many cases.

As described above, the first portion 4a plays a main role as the free ferromagnetic layer 4, and the second portions 4b play an auxiliary role of controlling the position and size of the edge domain of the free ferromagnetic layer 4 and the change in the magnetic structure in reversing the magnetization. Therefore, it is desirable for the second portions 4b to be smaller than the first portion 4a. For example, it is desirable for the length ratio $L_2/L_1$, which is a ratio of the length $L_2$ of the second portion 4b to the length $L_1$ of the first portion 4a, to be not larger than 1, preferably not larger than 0.75. Also, it is desirable for the ratio $W_2/W_1$, which is a ratio of the maximum width $W_2$ of the second portion 4b to the width $W_1$ of the first portion 4a, to be not larger than 0.5, preferably not larger than 0.3.

However, where the second portion 4b is excessively smaller than the first portion 4a, it is possible for the second portion 4b to fail to produce a sufficient effect. It follows that it is desirable for the ratio $L_2/L_1$ to be not smaller than 0.05, preferably not smaller than 0.1. Also, it is desirable for the ratio $W_2/W_1$ of the maximum width $W_2$ of the second portion to the width $W_1$ of the first portion to be not smaller than 0.05, preferably not smaller than 0.1.

It is desirable for the two second portions 4b to be formed in the diagonal positions of the first portion 4a. In this case, it is possible to control sufficiently the position and size of the edge domain and the change in the magnetic structure in reversing the magnetization, even if the second portion 4b is small.

In the first embodiment, it is desirable for the thickness of the free ferromagnetic layer 4 to be not greater than 50 nm, preferably not greater than 10 nm, and most preferably not greater than 5 nm. The lower limit of the thickness of the free ferromagnetic layer 4 is the thickness that prevents the free ferromagnetic layer 4 from losing its function as a ferromagnetic layer. Where the free ferromagnetic layer 4 is thinner, the coercive force of the free ferromagnetic layer 4 is rendered small. As a result, it is possible to lower the power consumption in writing information in the case where the magnetoresistance element 1 is used for preparing a magnetic memory.

A second embodiment of the present invention will now be described.

Figure 4:
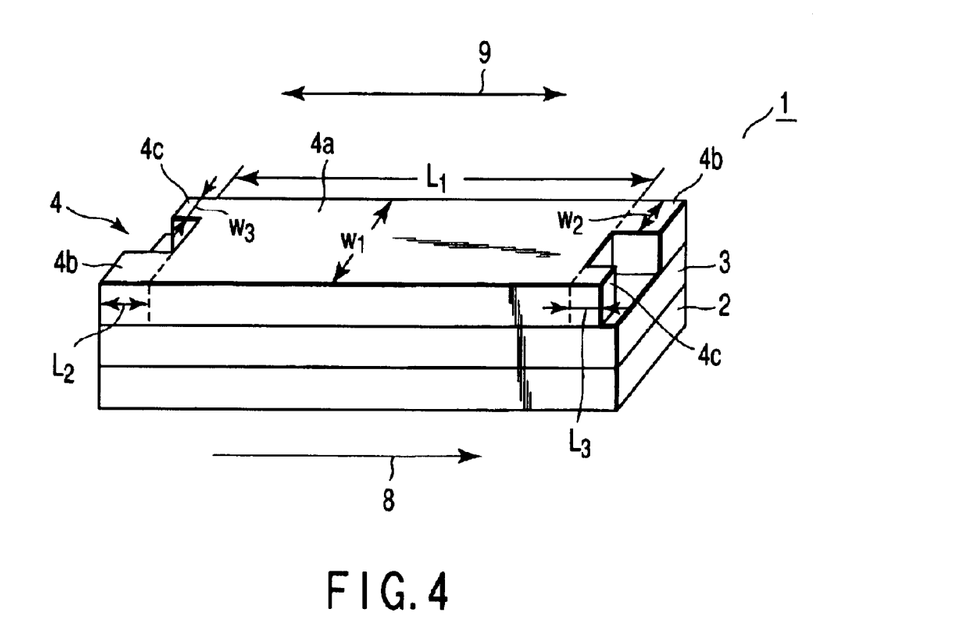
FIG. 4 is an oblique view schematically showing the construction of a magnetoresistance element according to a second embodiment of the present invention.

FIG. 4 is an oblique view schematically showing the construction of a magnetoresistance element 1 according to a second embodiment of the present invention. The magnetoresistance element 1 shown in FIG. 4 is substantially equal in construction to the magnetoresistance element 1 shown in FIG. 1, except that the element 1 shown in FIG. 4 differs from the element 1 shown in FIG. 1 in the shape of the free ferromagnetic layer 4. To be more specific, the free ferromagnetic layer 4 in the second embodiment of the present invention includes the first portion 4a, a pair of second portions 4b, and a pair of third portions 4c.

The third portions 4c are positioned apart from the second portions 4b and extend from the right and left sides or the edge surfaces of the first portion 4a in a direction perpendicular to the right and left sides or the side edges of the first portion 4a. The third portion 4c has an area smaller than that of the second portion 4b and plays the role of increasing and/or balancing the various effects produced by the arrangement of the second portion 4b.

It is desirable for the ratio $L_3/L_2$, which is a ratio of the length $L_3$ of the third portion 4c to the length $L_2$ of the second portion 4b, to be not larger than 1, preferably not larger than 0.7. Also, it is desirable for the ratio $W_3/W_2$, which is a ratio of the maximum width $W_3$ of the third portion 4c to the maximum width $W_2$ of the second portion 4b, to be not larger than 1, preferably not larger than 0.7. In this case, it is possible to suppress the decrease of the effect of controlling the position and size of the edge domain and the change in the magnetic structure in reversing the magnetization. Incidentally, the lower limit in each of the length ratio $L_3/L_2$ and the width ratio $W_3/W_2$ is not particularly limited. However, prominent effects are produced by the arrangement of the third portion 4c in the case where the length ratio $L_3/L_2$ is not smaller than 0.6 and in the case where the width ratio $W_3/W_2$ is not smaller than 0.5.

It is possible to variously modify the magnetoresistance element 1 according to each of the first and second embodiments described above.

Figure 5A:
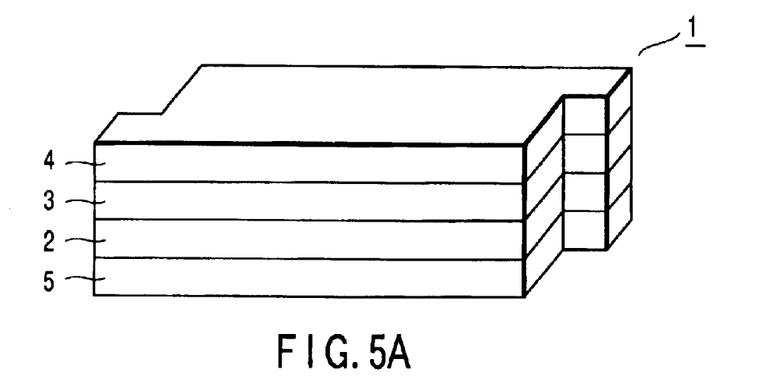
FIGS. 5A to 5C are oblique views schematically showing modifications of the magnetoresistance element according to the first embodiment of the present invention.
Figure 5B:
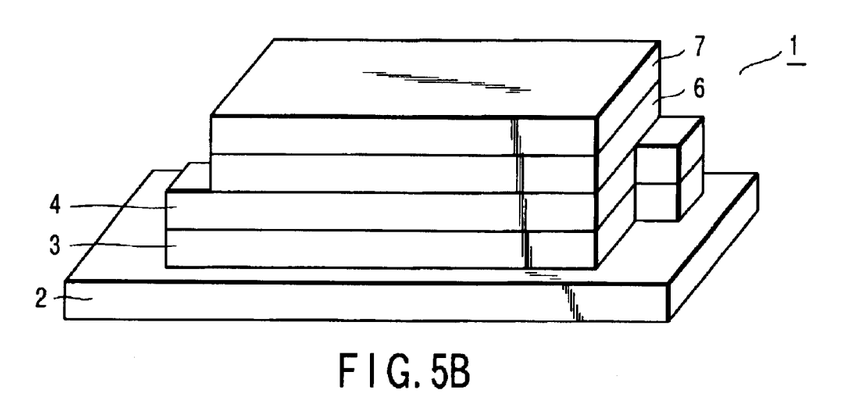
Figure 5C:
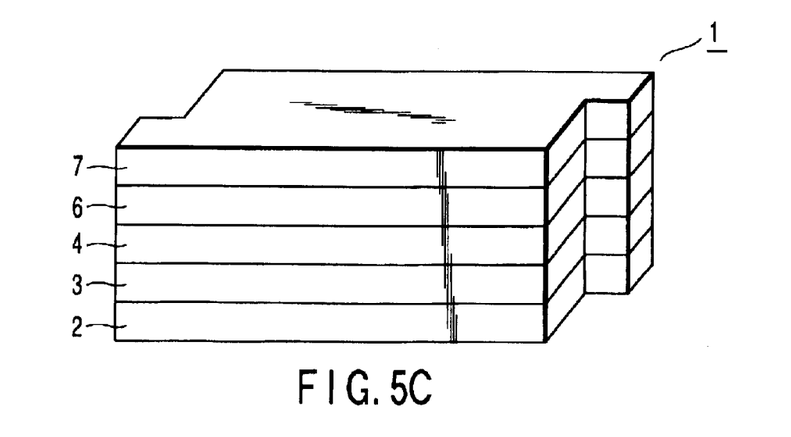

FIGS. 5A to 5C are oblique views schematically showing some modifications of the magnetoresistance element according to the first embodiment of the present invention.

In the magnetoresistance element 1 shown in FIG. 5A, an antiferromagnetic layer 5 is formed on the back surface of the pinned ferromagnetic layer 2. Where the antiferromagnetic layer 5 is formed adjacent to the pinned ferromagnetic layer 2 as shown in FIG. 5A, it is possible to fix more strongly the direction of magnetization of the pinned ferromagnetic layer 2. Also, in the magnetoresistance element 1 shown in FIG. 5A, each of the pinned ferromagnetic layer 2, the nonmagnetic layer 3 and the antiferromagnetic layer 5 is equal in shape to the free ferromagnetic layer 4. If this construction is employed, the patterning of the pinned ferromagnetic layer 2, the nonmagnetic layer 3, the free ferromagnetic layer 4 and the antiferromagnetic layer 5 can be performed by a single process.

In the magnetoresistance element 1 shown in FIG. 5B, a nonmagnetic layer 6 and a pinned ferromagnetic layer 7 are successively formed in the order mentioned on the back surface of the free ferromagnetic layer 4 that is positioned to face the pinned ferromagnetic layer 2. To be more specific, the magnetoresistance element 1 shown in FIG. 5B constitutes a ferromagnetic double tunnel junction element in which, for example, the nonmagnetic layers 3 and 6 act as tunnel insulating films. This construction is advantageous in obtaining a larger output voltage. Also, in the magnetoresistance element 1 shown in FIG. 5B, the nonmagnetic layer 3 and the free ferromagnetic layer 4 are equal to each other in shape, and the nonmagnetic layer 6 and the pinned ferromagnetic layer 7 are equal to each other in shape. The magnetoresistance element 1 of this construction can be obtained by, for example, patterning the pinned ferromagnetic layer 2, patterning the nonmagnetic layer 3 and the free ferromagnetic layer 4 in a single process, and further patterning the nonmagnetic layer 6 and the pinned ferromagnetic layer 7 in a single process.

The magnetoresistance element 1 shown in FIG. 5C is equal in construction to the magnetoresistance element 1 shown in FIG. 5B, except that the pinned ferromagnetic layers 2 and 7, the nonmagnetic layers 3 and 6, and the free ferromagnetic layer 4 are equal to each other in shape in the magnetoresistance element 1 shown in FIG. 5C. The magnetoresistance element 1 of this construction can be obtained by, for example, patterning the pinned ferromagnetic layer 2, the nonmagnetic layer 3, the free ferromagnetic layer 4, the nonmagnetic layer 6 and the pinned ferromagnetic layer 7 in a single process. Incidentally, in the magnetoresistance element 1 shown in each of FIGS. 5B and 5C, it is possible to form an antiferromagnetic layer on any one of the pinned ferromagnetic layers 2 and 7, or to form antiferromagnetic layers on both the pinned ferromagnetic layers 2 and 7.

Incidentally, it is possible to utilize the construction described above with reference to FIGS. 5A to 5C not only in the magnetoresistance element according to the first embodiment but in the magnetoresistance element according to the second embodiment.

It is possible to form the magnetoresistance element 1 described above with reference to FIGS. 1, 2 and 3A to 3C by utilizing a semiconductor process. In this case, it is possible for the lowermost layer in the drawing to face a semiconductor substrate or for the uppermost layer in the drawing to face the semiconductor substrate.

The free ferromagnetic layer 4 can be formed by, for example, forming a magnetic film or a magnetic laminated film by utilizing, for example, a sputtering method, followed by patterning the magnetic film or the magnetic laminated film by a standard photolithography technique. In this method, the free ferromagnetic layer 4 of the shape described above can be obtained by using, in the patterning step, a photomask patterned to conform with the planar shape of the free ferromagnetic layer 4. Incidentally, according to the embodiments, the coercive force of the free ferromagnetic layer 4 is not rendered significantly nonuniform, even if the shapes of the second portions 4b are somewhat nonuniform, as described above. It follows that the nonuniformity of the coercive force can be rendered sufficiently small even if the shape of the free ferromagnetic layer 4 is caused to be somewhat nonuniform due to errors in processing accuracy. Particularly, where the width ratio $W_2/W_1$ is not larger than 0.5, nonuniformity of the coercive force can be markedly decreased.

It is also possible to form the free ferromagnetic layer 4 as follows. Specifically, a magnetic film or a magnetic laminated film is processed first into a line-and-space pattern in the first step. This patterning can be performed with the error suppressed to several percent or less even if the width of each of the line and the space is set at, for example, 0.1 μm. Incidentally, the direction of the axis of easy magnetization is set to be equal to the longitudinal direction of each of the line and the space. Then, the line-and-space pattern is processed in the second step in a direction perpendicular to the axis of easy magnetization. The free ferromagnetic layer 4 of the shape described above is obtained by this method. Incidentally, it is possible for the processing in the second step to be a linear processing similar to the processing in the first step, or to be an ordinary processing using a mask. The influences given by the error, which is generated by the use of a mask, to the magnetic properties, particularly, the coercive force is small as described above.

The free ferromagnetic layer 4 can also be formed by utilizing an electron beam image depicting method. In this case, a high precision shape control can be performed for forming the second portion 4b of a desired shape by, for example, increasing the dose of the electron beam in the vicinity of the second portion 4b, or by performing the electron beam irradiation in a dot shape.

The magnetoresistance element 1 described above can be used in various fields, including, for example, magnetic memories, magnetic sensors, and magnetic heads of a magnetic reproducion apparatuses. The following description covers a magnetic memory utilizing the magnetoresistance element 1.

Figure 6A:
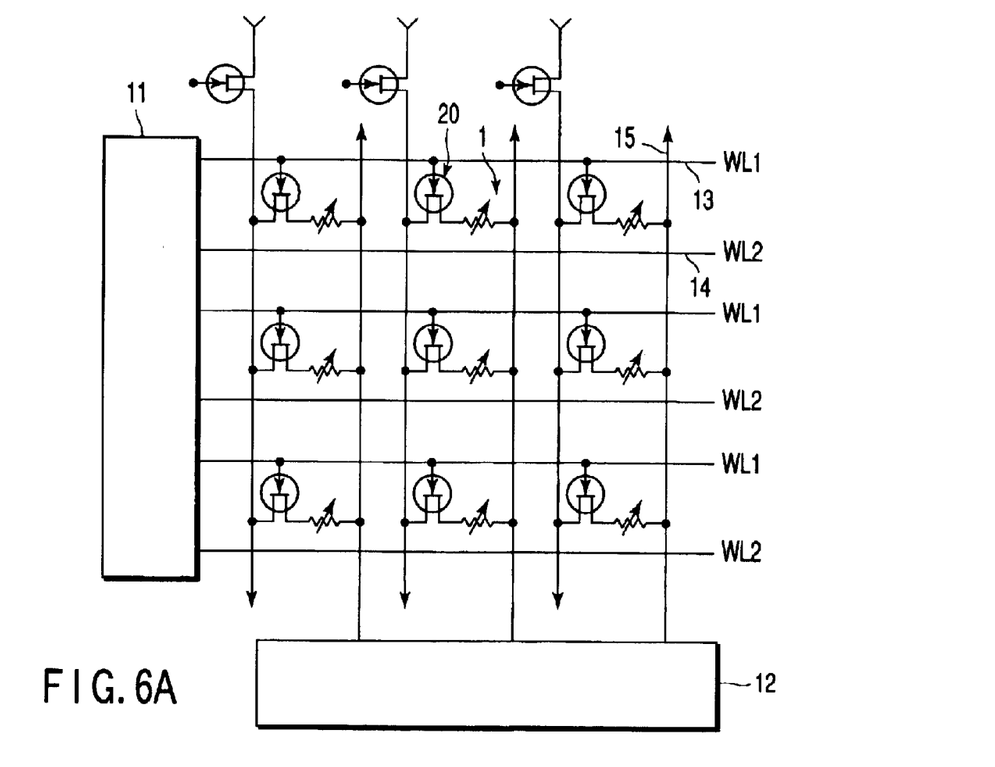
FIGS. 6A and 6B are equivalent circuit diagrams schematically exemplifying magnetic random access memories utilizing magnetoresistance effects elements according to the first and second embodiments, respectively, of the present invention.
Figure 6B:
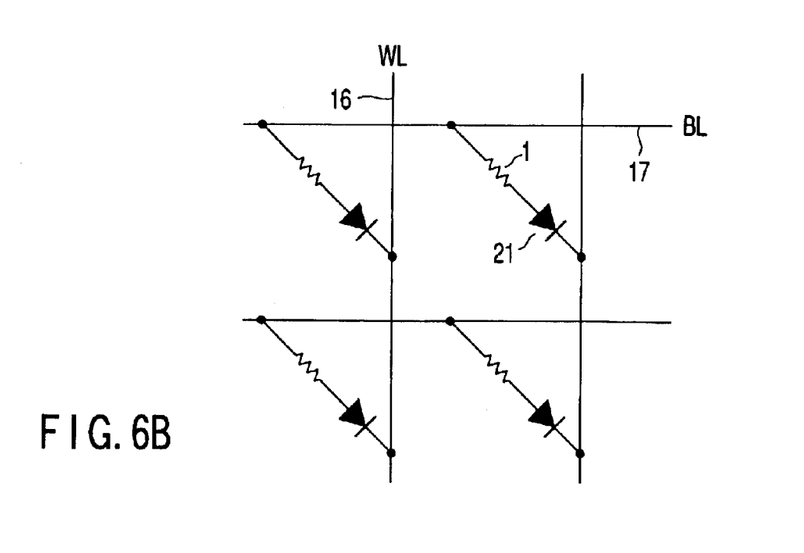

FIGS. 6A and 6B are equivalent circuit diagrams schematically showing, as examples, the construction of magnetic random access memories utilizing the magnetoresistance elements according to the first and second embodiments of the present invention.

In the magnetic random access memory (MRAM) shown in FIG. 6A, word lines (WL1) 13 for the reading and word lines (WL2) for the writing, which are connected to a row decoder 11, intersect bit lines 15 connected to a column decoder 12. Memory cells each including the magnetoresistance element 1 and a transistor 20, such as a MOSFET, are arranged in each of the intersections between the word lines 13, 14 and the bit line 15 or in the vicinity of the intersections noted above.

In writing information in the magnetoresistance element 1 in the MRAM shown in FIG. 6A, the magnetization of the free ferromagnetic layer 4 included in the magnetoresistance element 1 is reversed by the resultant magnetic field generated by passing a current pulse through the word line 14 and the bit line 15. Also, in reading the information written in the magnetoresistance element 1 included in the MRAM, an electric current is flowed through the magnetoresistance element 1 selected by the transistor 20, so as to judge whether the written information is "1" or "0", in accordance with the resistance of the magnetoresistance element 1.

In the MRAM shown in FIG. 6B, word lines 16 connected to a row decoder (not shown) intersect bit lines 17 connected to a column decoder (not shown). A memory cell includes the magnetoresistance element 1 and a diode 21 which are connected in series between the word line 16 and the bit line 17 and located in the vicinity of each of the intersections between the word lines 16 and the bit lines 17. It is possible to employ this circuit construction.

The magnetoresistance element 1 described above is used in the MRAM shown in each of FIGS. 6A and 6B. As a result, the power consumption is not markedly increased in the information writing stage and it is possible to obtain a large signal low in noise, even if the degree of integration is increased.

The magnetoresistance element 1 described above can be utilized in various MRAMs in addition to the MRAMs shown in FIGS. 6A and 6B. For example, in the MRAMs shown in FIGS. 6A and 6B, the memory cell is formed of the magnetoresistance element 1 and a switching element such as a transistor or a diode so as to make it possible to perform a nondestructive read. In the case of allowing the MRAM to perform a destructive read, it is unnecessary to use a switching element for forming the memory cell. Also, in the MRAM shown in each of FIGS. 6A and 6B, a single memory cell is formed of a single magnetoresistance element and a single switching element. However, it is also possible for a single memory cell to be formed of a plurality of magnetoresistance elements and a plurality of switching elements so as to allow the MRAM to perform a differential amplification read or a multiple-valued storage.

Some Examples of the present invention will now be described.

EXAMPLE 1

In this Example, a simulation was performed by using a computer in respect of the free ferromagnetic layer 4. Incidentally, in Example 1, NiFe was used as the material of the free ferromagnetic layer 4 and the thickness of the free ferromagnetic layer 4 was set at 2 nm.

FIGS. 7A to 7H show the planar shapes of the free ferromagnetic layers utilized for the simulation for Example 1. Each of the free ferromagnetic layers 4 shown in FIGS. 7A to 7H has an axis of easy magnetization, which is parallel to the y-direction. Also, the magnetoresistance element 1 having the free ferromagnetic layer 4 shaped as shown in FIGS. 7A to 7D represents an example of the present invention, and the magnetoresistance element 1 having the free ferromagnetic layer 4 shaped as shown in FIGS. 7E to 7H represents a comparative example. Incidentally, the dot-and-dash line shown in each of FIGS. 7A to 7D, which extends obliquely, corresponds to the straight line 42 shown in FIG. 2.

The size, etc. of the free ferromagnetic layer 4 utilized for the simulation will now be described.

Figure 7A:
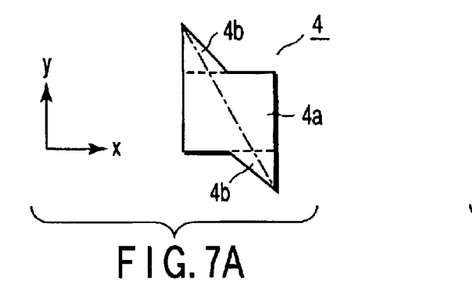
FIGS. 7A to 7H are plan views each showing the free ferromagnetic layer utilized in the simulation in Example 1.
Figure 7B:
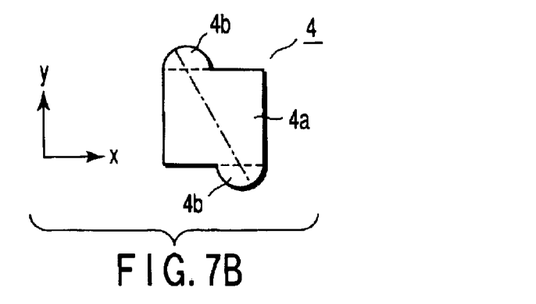
Figure 7C:
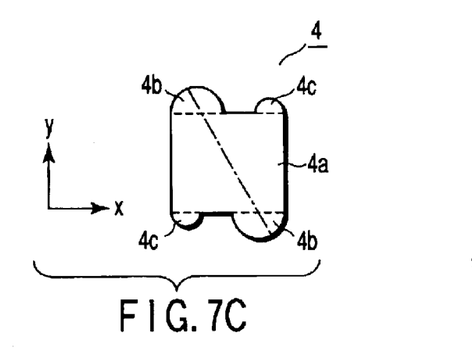

Concerning the free ferromagnetic layer 4 shown in each of FIGS. 7A to 7C, the first portion 4a was a square having a side of 0.1 μm, and each of the second portions 4b was shaped triangular, semi-circular or square. Concerning the free ferromagnetic layer 4 shown in FIG. 7A, the second portion 4b was shaped to form a right-angled isosceles triangle, and the calculation was performed in the cases where the width ratio $W_2/W_1$ described previously was set at 0.05, 0.1, 0.25, 0.5 and 0.75. Incidentally, where the second portion 4b is shaped triangular, the triangular shape need not be limited to a right-angled isosceles triangle. Concerning the free ferromagnetic layer 4 shown in FIG.

7B, the calculation was performed in the cases where the width ratio $W_2/W_1$ described previously was set at 0.25, 0.5 and 0.75. Further, concerning the free ferromagnetic layer 4 shown in FIG. 7C, the calculation was performed in the cases where the width ratio $W_2/W_1$ described previously was set at 0.25, 0.5 and 0.75.

Figure 7D:
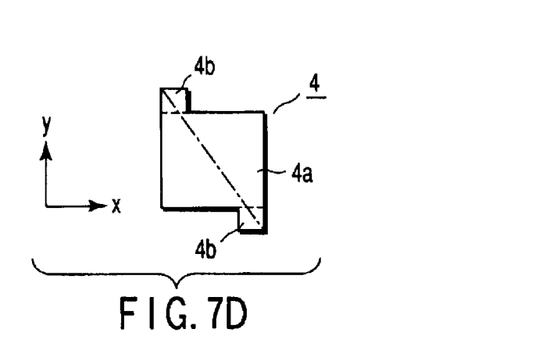

Concerning the free ferromagnetic layer 4 shown in FIG. 7D, the first portion 4a was a square having a side of 0.1 μm, and each of the second portion 4b and the third portion 4c was shaped semi-circular. In this case, the calculation was performed in the case where the width ratio $W_2/W_1$ was set at 0.5 and the width ratio $W_3/W_1$ was set at 0.25.

Figure 7E:
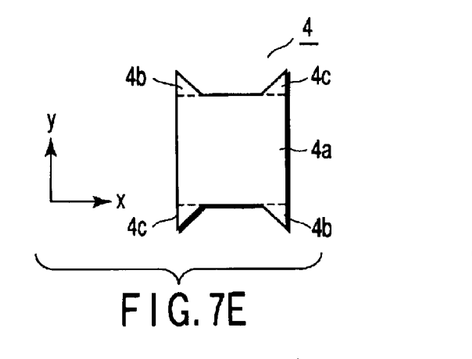
Figure 7F:
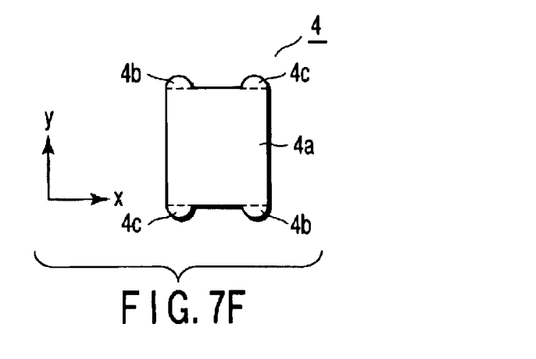
Figure 7G:
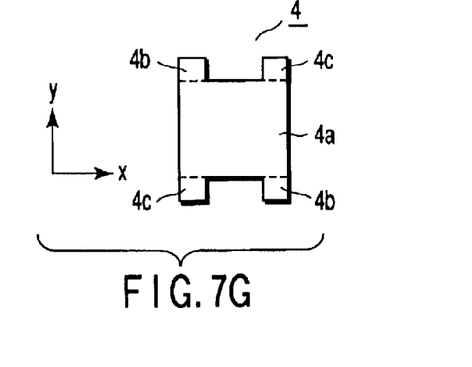

Concerning the free ferromagnetic layer 4 shown in each of FIGS. 7E to 7G, the first portion 4a was a square having a side of 0.1 μm, and each of the second portion 4b and the third portion 4c was shaped triangular, semi-circular or square. Concerning the free ferromagnetic layer 4 shown in FIG. 7E, the calculation was performed for the case where each of the width ratio $W_2/W_1$ and the width ratio $W_3/W_1$ was set at 0.25 or 0.5. Concerning the free ferromagnetic layer 4 shown in FIG. 7F, the calculation was performed for the case where each of the width ratio $W_2/W_1$ and the width ratio $W_3/W_1$ was set at 0.05, 0.25 or 0.5. Further, concerning the free ferromagnetic layer 4 shown in FIG. 7G, the calculation was performed for the case where each of the width ratio $W_2/W_1$ and the width ratio $W_3/W_1$ was set at 0.25.

Figure 7H:
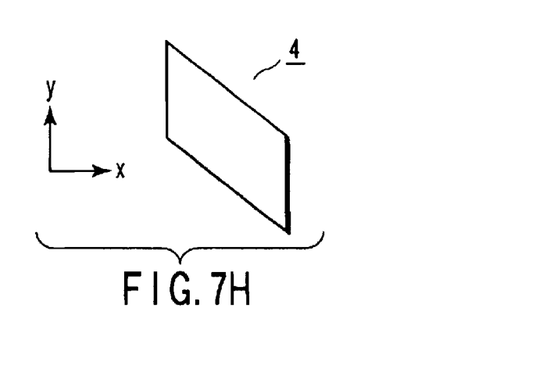

The free ferromagnetic layer 4 shown in FIG. 7H forms a parallelogram. Concerning the free ferromagnetic layer 4 shown in FIG. 7H, the calculation was performed on the assumption that the parallelogram had a bottom side of 0.1 μm, a height of 0.1 μm, and an acute angle of 45°.

Figure 8:
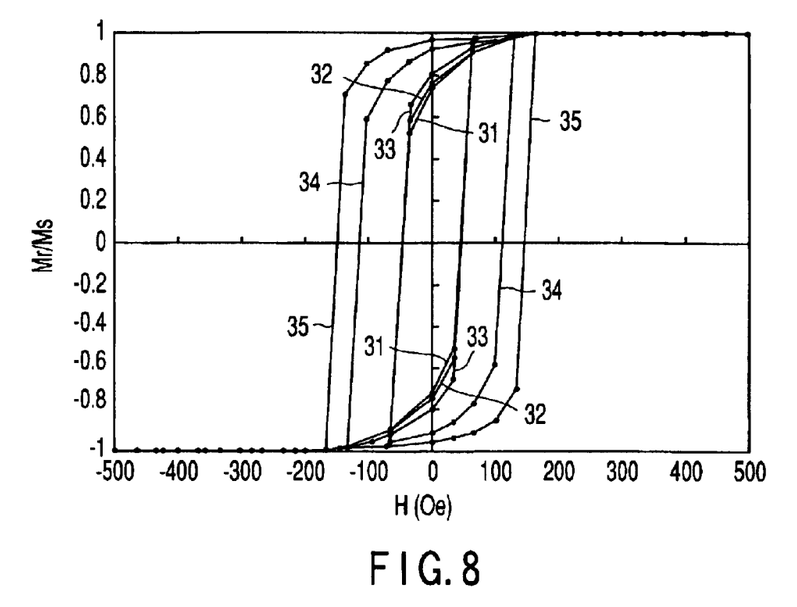
FIG. 8 is a graph showing the data obtained in respect of the free ferromagnetic layer shaped as shown in FIG. 7A.

FIG. 8 is a graph showing the data obtained in respect of the free ferromagnetic layer shaped as shown in FIG. 7A. The coercive force $H_c$ of the free ferromagnetic layer 4 is plotted on the abscissa of the graph, with the squareness ratio $M_r/M_s$ being plotted on the ordinate. FIG. 8 shows hysteresis curves 31 to 35. These hysteresis curves 31 to 35 represent the data obtained in the cases where the width ratio $W_2/W_1$ was set at 0.05, 0.1, 0.25, 0.5 and 0.75, respectively. As apparent from FIG. 8, both the squareness ratio $M_r/M_s$ and the coercive force $H_c$ are greatly dependent on the size of the second portion 4b.

Figure 9:
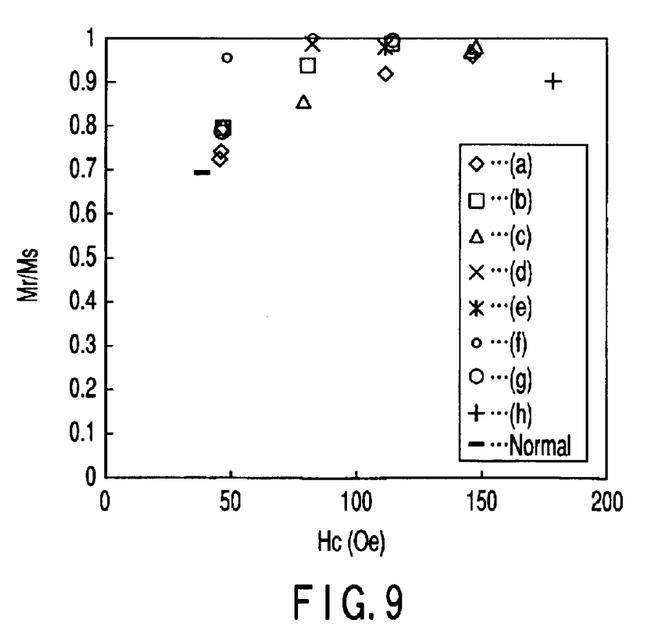
FIG. 9 is a graph showing the data obtained in respect of the free ferromagnetic layers shaped as shown in FIGS. 7A to 7H.

FIG. 9 is a graph showing the data obtained in respect of the free ferromagnetic layers shaped as shown in FIGS. 7A to 7H. The coercive force $H_c$ of the free ferromagnetic layer 4 is plotted on the abscissa of the graph, with the squareness ratio $M_r/M_s$ being plotted on the ordinate. Incidentally, the indication "Normal" in FIG. 9 represents the data obtained in the case where the planar shape of the free ferromagnetic layer 4 is square. Table 1 shows the data corresponding to FIG. 9.

TABLE 1

| Plane geometry of free ferromagnetic layer | $W_2/W_1$ | $W_3/W_1$ | Hc(Oe) | $M_r/M_s$ |
|---|---|---|---|---|
| Normal | — | — | 37.9 | 0.7 |
| (a) | 0.05 | — | 45.2 | 0.73 |
|  | 0.10 | — | 45.8 | 0.75 |
|  | 0.25 | — | 47.2 | 0.8 |
|  | 0.50 | — | 112.5 | 0.92 |
|  | 0.75 | — | 147.3 | 0.96 |
| (b) | 0.25 | — | 47.0 | 0.80 |
|  | 0.50 | — | 81.2 | 0.94 |
|  | 0.75 | — | 115.5 | 0.99 |
| (c) | 0.25 | — | 79.2 | 0.86 |
|  | 0.50 | — | 146.3 | 0.97 |
|  | 0.75 | — | 149.1 | 0.98 |
| (d) | 0.50 | 0.25 | 82.9 | 0.99 |
| (e) | 0.25 | 0.25 | 112.9 | 0.98 |
|  | 0.50 | 0.50 | 249.9 | 0.99 |
| (f) | 0.05 | 0.05 | 46.5 | 0.79 |
|  | 0.25 | 0.25 | 48.7 | 0.96 |
|  | 0.50 | 0.50 | 83.3 | 1.00 |
| (g) | 0.25 | 0.25 | 116.0 | 1.00 |
| (h) | — | — | 179.8 | 0.90 |

As apparent from FIG. 9 and Table 1, the tendency obtained in respect of the free ferromagnetic layer 4 shaped as shown in FIG. 7A was found to be similar to that obtained in respect of the free ferromagnetic layer 4 of the other shape. Also, in the case of forming the second portions 4b, it was possible to improve the squareness ratio $M_r/M_s$ independently of the shape of the second portion 4b. As a matter of fact, the squareness ratio $M_r/M_s$ obtained in respect of the free ferromagnetic layer 4 shaped as shown in FIG. 7A and the having the width ratio $W_2/W_1$ of 0.05 was found to be 0.73 in contrast to the squareness ratio $M_r/M_s$ of 0.7 in the case of the free ferromagnetic layer 4 having a square planar shape. In other words, the squareness ratio $M_r/M_s$ was increased by 4%. Also, a higher squareness ratio $M_r/M_s$ was obtained in the case of the other free ferromagnetic layers 4 having the planar shapes as shown in FIGS. 7A to 7D.

As described previously, it is practically undesirable for the coercive force to be excessively large. As shown in Table 1, the coercive force of the free ferromagnetic layer 4 is made larger in the case of forming the second portion 4b than in the case where the free ferromagnetic layer 4 has a square planar shape (Normal). This means that two states of magnetization of the free ferromagnetic layer 4 become more stable by the second portions, which is preferable in terms of stability of information stored. However, the increase in the coercive force is markedly suppressed, compared with the free ferromagnetic layer 4 having the planar shape as shown in FIG. 7H. The increase in the coercive force caused by the formation of the second portion 4b is very small in, particularly, the cases where the free ferromagnetic layer 4 has a planar shape as shown in FIG. 7A and has a width ratio $W_2/W_1$ of 0.05, 0.1 or 0.25, where the free ferromagnetic layer 4 has a planar shape as shown in FIG. 7B and has a width ratio $W_2/W_1$ of 0.25, and where the free ferromagnetic layer 4 has a planar shape as shown in FIG. 7C and has a width ratio $W_2/W_1$ of 0.05 or 0.25. As pointed out above, it is possible to improve markedly the squareness ratio $W_2/W_1$ without bringing about a large increase in the coercive force in the case where the construction shown in any of FIGS. 7A to 7D is employed in the free ferromagnetic layer 4. In other words, it is possible to stabilize two stable states of the magnetization and lower the switching current, simultaneously.

Also, it is possible to suppress the nonuniformity of the coercive force in the case where the construction shown in any of FIGS. 7A to 7D is employed in the free ferromagnetic layer 4. This will now be described with reference to FIGS. 10A and 10B.

Figure 10A:
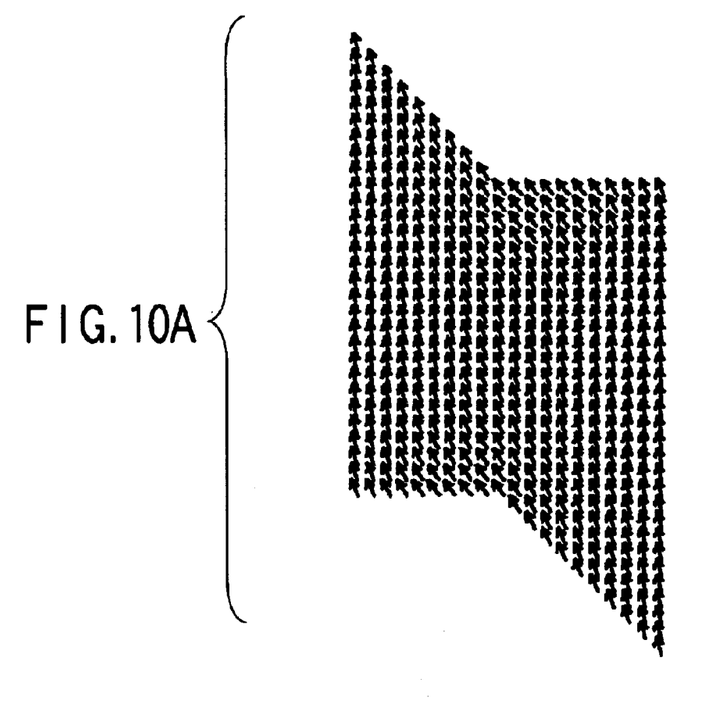
FIGS. 10A and 10B schematically show the situation of the magnetic domain in the free ferromagnetic layer when an external magnetic field is not applied to the free ferromagnetic layer.
Figure 10B:
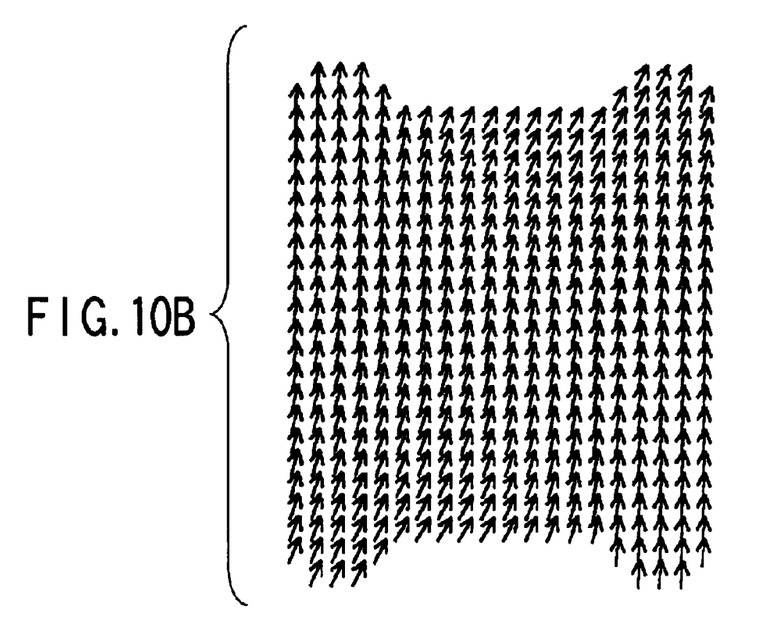

Each of FIGS. 10A and 10B schematically shows how a magnetic domain is formed in the free ferromagnetic layer when an external magnetic field is not applied to the free ferromagnetic layer 4. To be more specific, FIG. 10A shows the result of the calculation performed on the basis of the micro-magnetics in respect of the magnetic domain of the free ferromagnetic layer 4 shown in FIG. 7A. On the other hand, FIG. 10B shows the result of the calculation performed on the basis of the micro-magnetics in respect of the magnetic domain of the free ferromagnetic layer 4 shown in FIG. 7F. Incidentally, the arrows in FIGS. 10A and 10B denote the direction of the magnetization.

In FIG. 10A, the direction of the magnetization is moderately changed along the contour of the free ferromagnetic layer 4 and an average direction of magnetization is substantially parallel to the diagonal of the square. Also, in FIG. 10B, the free ferromagnetic layer 4 is magnetized in substantially the same direction, although the average direction of magnetization is slightly inclined in the y-axis direction (vertical direction in the drawing). In other words, it is considered reasonable to understand that the free ferromagnetic layer 4 is substantially formed of a single magnetic domain in each of FIGS. 10A and 10B.

As shown in Table 1, the coercive force is dispersed within a range of between 48.7 Oe and 116.0 Oe in the case of employing the constructions shown in FIGS. 7E to 7G under the condition that each of the width ratios $W_2/W_1$ and $W_3/W_1$ is constant (=0.25). On the other hand, the dispersion of the coercive force under the condition that the width ratio $W_2/W_1$ is set constant at 0.25 is suppressed to fall within a range of between 47.0 Oe and 79.2 Oe in each of the cases where the constructions shown in FIGS. 7A to 7C are employed in the free ferromagnetic layers 4. It follows that, in the case of employing the construction shown in any of FIGS. 7A to 7D in the free ferromagnetic layer 4, it is possible to suppress the nonuniformity of the coercive force even if the shape of the free ferromagnetic layer 4 is rendered nonuniform in the patterning step.

EXAMPLE 2

In Example 2, the simulation was performed under the conditions similar to those described previously in conjunction with Example 1, except that the axis of easy magnetization of the free ferromagnetic layer 4, which has the planar shape as shown in any of FIGS. 7A to 7D, was set parallel to the x-direction. Incidentally, the magnetoresistance element 1 having such a free ferromagnetic layer 4 corresponds to a comparative example.

Figure 11:
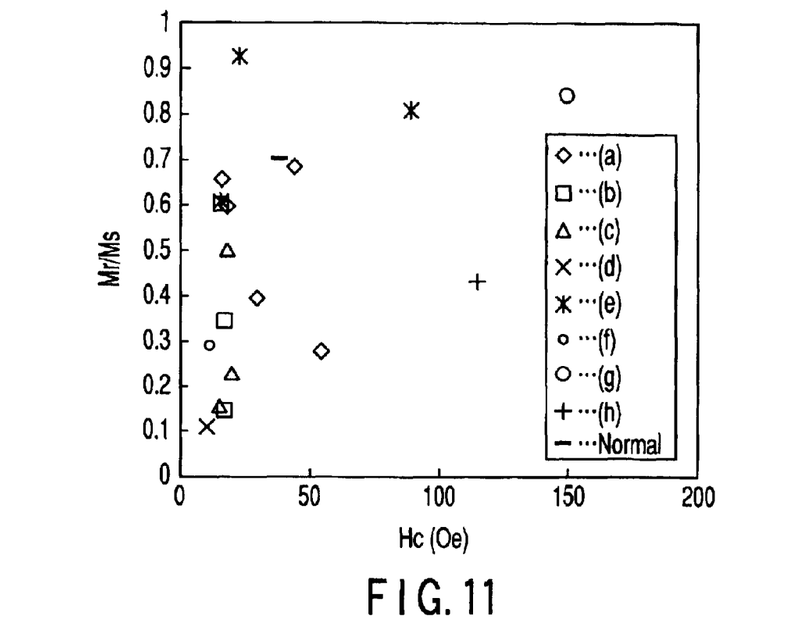
FIG. 11 is a graph showing the data obtained in respect of the free ferromagnetic layers shaped as shown in FIGS. 7A to 7H and having an axis of easy magnetization in the x-direction.

FIG. 11 is a graph showing the data obtained in respect of the free ferromagnetic layer 4 shaped as shown in any of FIGS. 7A to 7H and having the axis of easy magnetization formed in the x-direction. The coercive force $H_c$ of the free ferromagnetic layer 4 is plotted on the abscissa of the graph, with the squareness ratio $M_r/M_s$ being plotted on the ordinate. Also, the indication "Normal" in the graph denotes the data obtained in the case where the free ferromagnetic layer 4 had a square planar shape. Incidentally, Table 2 shows the data corresponding to FIG. 11.

TABLE 2

| Plane geometry of free ferromagnetic layer | $W_2/W_1$ | $W_3/W_1$ | Hc(Oe) | $M_r/M_s$ |
|---|---|---|---|---|
| Normal | — | — | 37.922 | 0.700 |
| (a) | 0.05 | — | 43.676 | 0.682 |
|  | 0.10 | — | 15.977 | 0.655 |

TABLE 2-continued

| Plane geometry of free ferromagnetic layer | $W_2/W_1$ | $W_3/W_1$ | Hc(Oe) | $M_r/M_s$ |
|---|---|---|---|---|
|  | 0.25 | — | 17.218 | 0.594 |
|  | 0.50 | — | 28.738 | 0.393 |
|  | 0.75 | — | 54.511 | 0.280 |
| (b) | 0.25 | — | 15.107 | 0.600 |
|  | 0.50 | — | 16.845 | 0.348 |
|  | 0.75 | — | 16.814 | 0.148 |
| (c) | 0.25 | — | 17.274 | 0.497 |
|  | 0.50 | — | 19.660 | 0.231 |
|  | 0.75 | — | 15.269 | 0.158 |
| (d) | 0.50 | 0.25 | 9.950 | 0.110 |
| (e) | 0.05 | 0.05 | 14.811 | 0.608 |
|  | 0.25 | 0.25 | 22.131 | 0.921 |
|  | 0.50 | 0.50 | 89.168 | 0.806 |
| (f) | 0.25 | 0.25 | 10.626 | 0.290 |
| (g) | 0.25 | 0.25 | 149.853 | 0.836 |
| (h) | — | — | 115.825 | 0.431 |

As apparent from FIG. 11 and Table 2, if the axis of easy magnetization is formed in the x-direction, the squareness ratio $M_r/M_s$ tends to be lowered in the case of forming the second portion 4b, compared with the case where the free ferromagnetic layer 4 has a square planar shape. In addition, the squareness ratio $M_r/M_s$ is greatly dependent on the size and shape of the second portion 4b. In other words, where the axis of easy magnetization is formed in the x-direction, it is difficult to obtain stably a high squareness ratio $M_r/M_s$.

EXAMPLE 3

In Example 3, the simulation was performed under the conditions similar to those described previously in conjunction with Example 1, except that CoFe was used as the material of the free ferromagnetic layer 4.

Figure 12:
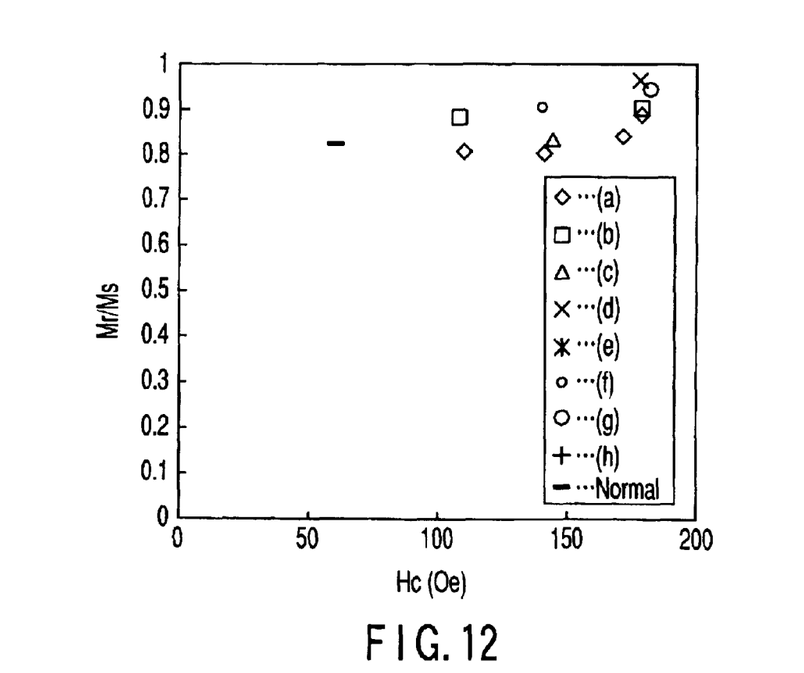
FIG. 12 is a graph showing the data in respect of the free ferromagnetic layers shaped as shown in FIGS. 7A to 7H and using CoFe as the magnetic material.

FIG. 12 is a graph showing the data obtained in respect of the free ferromagnetic layer shaped as shown in any of FIGS. 7A to 7H and prepared by using CoFe as the magnetic material. The coercive force $H_c$ of the free ferromagnetic layer 4 is plotted on the abscissa of the graph, with the squareness ratio $M_r/M_s$ being plotted on the ordinate. Also, the indication "Normal" in the graph denotes the data obtained in the case where the free ferromagnetic layer 4 had a square planar shape. Incidentally, Table 3 shows the data corresponding to FIG. 12.

TABLE 3

| Plane geometry of free ferromagnetic layer | $W_2/W_1$ | $W_3/W_1$ | Hc(Oe) | $M_r/M_s$ |
|---|---|---|---|---|
| Normal | — | — | 60.799 | 0.826 |
| (a) | 0.05 | — | 109.720 | 0.815 |
|  | 0.10 | — | 170.788 | 0.845 |
|  | 0.25 | — | 141.074 | 0.811 |
|  | 0.50 | — | 178.630 | 0.895 |
|  | 0.75 | — | 245.060 | 0.947 |
| (b) | 0.25 | — | 108.260 | 0.887 |
|  | 0.50 | — | 178.757 | 0.908 |
|  | 0.75 | — | 214.799 | 0.979 |
| (c) | 0.25 | — | 143.332 | 0.840 |
|  | 0.50 | — | 213.337 | 0.928 |
|  | 0.75 | — | 313.883 | 0.958 |
| (d) | 0.50 | 0.25 | 178.244 | 0.972 |
| (e) | 0.25 | 0.25 | 206.932 | 0.914 |
| (f) | 0.25 | 0.25 | 139.600 | 0.914 |
| (g) | 0.25 | 0.25 | 182.309 | 0.953 |

TABLE 3-continued

| Plane geometry of free ferromagnetic layer | $W_2/W_1$ | $W_3/W_1$ | Hc(Oe) | $M_r/M_s$ |
|---|---|---|---|---|
| (h) | — | — | 342.365 | 0.897 |

As apparent from FIG. 12 and Table 3, a result similar to that in the case of using NiFe was also obtained in the case of using CoFe as the material of the free ferromagnetic layer. To be more specific, in the case of employing the planar shape as shown in FIGS. 7A to 7D in the free ferromagnetic layer 4, it was possible to improve the squareness ratio $M_r/M_s$ without bringing about a significant increase in the coercive force $H_c$. Also, the coercive force $H_c$ and the squareness ratio $M_r/M_s$ were prevented from being rendered significantly nonuniform by the nonuniformity in the shape of the second portion 4b.

In Examples 1 to 3 given above, NiFe or CoFe was used as the material of the free ferromagnetic layer 4. However, it is possible to use other materials for forming the free ferromagnetic layer 4. For example, it is possible to use metals such as Fe, Ni and Co, alloys thereof, and magnetic oxides such as $Fe_2O_3$ and $LaMnO_3$ as the material of the free ferromagnetic layer 4. Also, it is possible for the free ferromagnetic layer 4 to be of a single layer structure or of a laminate structure. In the case of employing a laminate structure in the free ferromagnetic layer 4, it is possible to laminate a plurality of different magnetic layers one upon the other or to laminate alternately a magnetic layer and another layer selected from the group consisting of a nonmagnetic layer, a dielectric layer and an insulating layer one upon the other.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistance element, comprising:
a first pinned ferromagnetic layer that retains a magnetization direction thereof unchanged on applying a magnetic field;
a free ferromagnetic layer that faces the first pinned ferromagnetic layer and is capable of changing a magnetization direction thereof on applying the magnetic field; and
a first nonmagnetic layer intervening between the first pinned ferromagnetic layer and the free ferromagnetic layer,
wherein a shape of the free ferromagnetic layer that is viewed perpendicularly to a main surface thereof includes a first portion with a parallelogrammic contour and a pair of second portions that protrude from a pair of opposite corners of the first portion respectively in a main direction parallel to a pair of opposite sides of the first portion,
the shape of the free ferromagnetic layer is asymmetric with respect to a line that passes through a center of the first portion and is parallel to the main direction, and
an axis of easy magnetization of the free ferromagnetic layer falls within a range defined by an acute angle that a first direction makes with a second direction, the first direction being substantially parallel to the main direction and the second direction being substantially parallel to the longest line segment that joins contours of the second portions.

2. The element according to claim 1, wherein a direction of the magnetization of the first pinned ferromagnetic layer falls within the range defined by the acute angle.

3. The element according to claim 1, further comprising:
a second pinned ferromagnetic layer that retains a magnetization direction thereof unchanged on applying the magnetic field; and
a second nonmagnetic layer intervening between the free ferromagnetic layer and the second pinned ferromagnetic layer.

4. The element according to claim 1, wherein the first portion is square or rectangle in shape.

5. The element according to claim 1, the second portions are rotation symmetrical with respect to a 2-fold axis that passes through the center of the first portion and is perpendicular to the main surface of the free ferromagnetic layer.

6. The element according to claim 1, wherein each of the second portions is triangle, semi-circle, square or rectangle in shape.

7. The element according to claim 1, wherein the shape of the first free ferromagnetic layer consists of the first and second portions.

8. A magnetic memory, comprising:
a word line;
a bit line intersecting the word line; and
a memory cell positioned at or near an intersection portion of the word and bit lines and including the element according to claim 1.

9. The memory according to claim 8, wherein a direction of the magnetization of the first pinned ferromagnetic layer falls within the range defined by the acute angle.

10. The memory according to claim 8, wherein the element further comprises:
a second pinned ferromagnetic layer that retains a magnetization direction thereof unchanged on applying the magnetic field; and
a second nonmagnetic layer intervening between the free ferromagnetic layer and the second pinned ferromagnetic layer.

11. The memory according to claim 8, wherein the first portion is square or rectangle in shape.

12. The memory according to claim 8, the second portions are rotation symmetrical with respect to a 2-fold axis that passes through the center of the first portion and is perpendicular to the main surface of the free ferromagnetic layer.

13. The memory according to claim 8, wherein each of the second portions is triangle, semi-circle, square or rectangle in shape.

14. The memory according to claim 8, wherein the shape of the first free ferromagnetic layer consists of the first and second portions.

15. A magnetoresistance element, comprising:
a first pinned ferromagnetic layer that retains a magnetization direction thereof unchanged on applying a magnetic field;
a free ferromagnetic layer that faces the first pinned ferromagnetic layer and is capable of changing a magnetization direction thereof on applying the magnetic field; and
a first nonmagnetic layer intervening between the first pinned ferromagnetic layer and the free ferromagnetic layer, wherein a shape of the free ferromagnetic layer that is viewed perpendicularly to a main surface thereof includes a first portion with a quadrilateral contour whose first opposite sides are parallel to each other and whose second opposite sides are parallel to each other, and a pair of second portions that extend from a pair of opposite corner parts of the first portion in a main direction parallel to the second opposite sides respectively and whose maximum widths in a direction parallel to the first opposite sides are narrower than lengths of the first opposite sides, the shape is asymmetric with respect to a line that passes through a center of the first portion and is parallel to the second opposite sides, and an axis of easy magnetization of the free ferromagnetic layer falls within a range defined by an acute angle that a first direction makes with a second direction, the first direction being substantially parallel to the main direction and the second direction being substantially parallel to the longest line segment that joins contours of the second portions.

16. The element according to claim 15, wherein a direction of the magnetization of the first pinned ferromagnetic layer falls within the range defined by the acute angle.

17. The element according to claim 15, further comprising:

a second pinned ferromagnetic layer that retains a magnetization direction thereof unchanged on applying the magnetic field; and a second nonmagnetic layer intervening between the free ferromagnetic layer and the second pinned ferromagnetic layer.

18. A magnetic memory, comprising:

a word line;

a bit line intersecting the word line; and a memory cell positioned at or near an intersection portion of the word and bit lines and including the element according to claim 15.

19. A magnetoresistance element, comprising:

a first pinned ferromagnetic layer that retains a magnetization direction thereof unchanged on applying a magnetic field;

a free ferromagnetic layer that faces the first pinned ferromagnetic layer and is capable of changing a magnetization direction thereof on applying the magnetic field; and a first nonmagnetic layer intervening between the first pinned ferromagnetic layer and the free ferromagnetic layer, wherein a shape of the free ferromagnetic layer that is viewed perpendicularly to a main surface thereof includes a first portion with a parallelogrammic contour, and a pair of second portions that protrude from a pair of opposite corners of the first portion respectively in a main direction parallel to a pair of opposite sides of the first portion, the shape of the free ferromagnetic layer is asymmetric with respect to a line that passes through a center of the first portion and is parallel to the main direction, and a direction of the magnetization of the first pinned ferromagnetic layer falls within a range defined by an acute angle that a first direction makes with a second direction, the first direction being substantially parallel to the main direction and the second direction being substantially parallel to the longest line segment that joins contours of the second portions.

20. A magnetic memory, comprising:

a word line;

a bit line intersecting the word line; and a memory cell positioned at or near an intersection portion of the word and bit lines and including the element according to claim 19.

* * * * *